United States Patent [19]
Bliss et al.

[11] Patent Number: 5,656,079
[45] Date of Patent: Aug. 12, 1997

[54] STATEMENT OF GOVERNMENT INTEREST

[75] Inventors: David Bliss, Arlington; George Bryant, Waltham; David Gabbe, Brookline, all of Mass.

[73] Assignee: The United States of America as represented by the Air Force, Washington, D.C.

[21] Appl. No.: 403,089

[22] Filed: Mar. 13, 1995

Related U.S. Application Data

[63] Continuation-in-part of Ser. No. 25,208, Feb. 26, 1993, Pat. No. 5,493,985.
[51] Int. Cl.$^6$ ............................................. C30B 11/02
[52] U.S. Cl. .................... 117/223; 117/77; 117/81; 117/82; 117/83; 117/935
[58] Field of Search ........................ 117/77, 81, 82, 117/83, 223, 935

[56] References Cited

U.S. PATENT DOCUMENTS

| | | | |
|---|---|---|---|
| 3,853,487 | 12/1974 | Meuleman et al. | 117/223 |
| 4,055,457 | 10/1977 | Swinehart | 117/83 |
| 4,190,486 | 2/1980 | Kyle | 117/83 |
| 4,904,336 | 2/1990 | Ozawa et al. | 117/917 |
| 5,135,726 | 8/1992 | Min et al. | 117/223 |
| 5,438,953 | 8/1995 | Aoki et al. | 117/223 |

FOREIGN PATENT DOCUMENTS

| | | | |
|---|---|---|---|
| 1353917 | 5/1974 | United Kingdom | 117/77 |

*Primary Examiner*—Robert Kunemund
*Attorney, Agent, or Firm*—Stanton E. Collier

[57] ABSTRACT

The present invention is an apparatus for the synthesis and growth of single crystals of phosphorus compounds starting with the elemental materials in a single furnace without external exposure. The apparatus of the present invention is a crystal growth furnace heated by RF coils. Inside the furnace is a susceptor heated by a lower coil device for holding a crucible. Above the crucible is selectively positioned a phosphorus improved injector. The improved injector is further surrounded by a susceptor which is heated by an upper coil device. The non-phosphorus materials are placed in the crucible and melted to a desired temperature. The phosphorus material previously placed within the injector is heated by the radiant heat from both crucible and the upper susceptor to drive the phosphorus vapor into the melt through a tube. This is closely controlled by noting the temperature within the injector and adjusting the height of the injector above the melt to control the temperature within the phosphorus material. After the formation of the stoichiometric melt, the seed is inserted into the melt for crystal growth if so desired. A further improvement to the above apparatus is the use of an improved injector having a cover and a shield thereabout. The injector and cover have a central hole through which the seed is inserted. The injector is moved vertically within the cover to provide the proper temperature therein.

5 Claims, 14 Drawing Sheets

▨ B₂O₃
▧ INDIUM
☰ PHOSPHOROUS
⋮⋮ INDIUM PHOSPHIDE

INJECTOR, 10
CRUCIBLE, 18
RF COILS, 22
SUSCEPTOR, 20
HEAT SHIELD

▨ B₂O₃
▧ INDIUM
☰ PHOSPHOROUS
⋮⋮ INDIUM PHOSPHIDE

HEAT SHIELD

- ▨ B₂O₃
- ▧ INDIUM
- ▤ PHOSPHOROUS
- ▦ INDIUM PHOSPHIDE

SEED ROD, 26
SEED, 24

- ▨ B₂O₃
- ▧ INDIUM
- ▤ PHOSPHOROUS
- ▦ INDIUM PHOSPHIDE

SEED ROD
SEED
InP SINGLE CRYSTAL

RATE OF TEMPERATURE RISE
INSIDE THE P INJECTOR

FIG. 5

| DESCRIPTION | IN CHARGE WEIGHT, g | SPENT PHOSPHORUS, g | FINAL WT. OF CHARGE, g | PHOSPHOROUS LOSS, g | MOLE FRACTION PHOSPHORUS |
|---|---|---|---|---|---|
| INJECTOR EXPERIMENT II | 450.3 | 116.7 | 564.7 | 2.3 | .490 |
| INJECTOR EXPERIMENT III | 454.9 | 117.4 | 569.5 | 2.8 | .489 |
| Fe-InP 5E 15/CM³ | 402.8 | 104.2 | 503.6 | 3.4 | .489 |
| VENDOR A INDIUM | 466.4 | 108.6 | 568 | -.7 | .465 |
| VENDOR B INDIUM | 400 | 102 | 497.5 | 4.5 | .486 |
| VENDOR C INDIUM | 448 | 115.7 | 559.7 | 4.0 | .489 |

FIG.6

| | SEED | | TAIL | |
|---|---|---|---|---|
| | $N_D - N_A$ (cm$^{-3}$) | $\mu$ (cm$^2$/V·sec) | $N_D - N_A$ (cm$^{-3}$) | $\mu$ (cm$^2$/V·sec) |
| VENDOR A  RT | 4.9E15 | 4,250 | 5.6E15 | 4,380 |
| VENDOR A  77 K | 4.3E15 | 28,600 | 4.7E15 | 24,000 |
| VENDOR B  RT | 4.2E15 | 4,300 | 3.14E15 | 4,600 |
| VENDOR B  77 K | 3.8E15 | 31,000 | 2.8E15 | 37,000 |
| VENDOR C  RT | 4.3E15 | 4,460 | 3.3E15 | 4,500 |
| VENDOR C  77 K | 3.87E15 | 34,000 | 2.9E15 | 38,000 |

IRON DOPING THRESHOLD TO OBTAIN SEMI-INSULATING InP

5,656,079

STATEMENT OF GOVERNMENT INTEREST

The present application is a continuation in part of U.S. patent application Ser. No. 08/025,208 filed on Feb. 26, 1993 which is now U.S. Pat. No. 5,493,985.

STATEMENT OF GOVERNMENT INTEREST

The invention described herein may be manufactured and used by or for the Government for governmental purposes without the payment of any royalty thereon.

BACKGROUND OF THE INVENTION

Bulk indium phosphide crystals are commercially grown by a two-step process: synthesis of the polycrystalline compound in one furnace followed by growth of the single crystal in another. Transferring the material from one furnace to another requires time and care to avoid the possibility of contamination. Furthermore, since stoichiometry is controlled only during the first step, it is difficult to prevent phosphorus loss in step two when heating/remelting the charge material. Prior art attempts at in-situ growth resulted in poor quality single crystals of unknown stoichiometry because it was very difficult to control the phosphorus vapor pressure during synthesis.

Several attempts to grow high quality single crystals having phosphorus of bulk dimensions have been made but none have successfully produced the quality of crystals made by the present invention. As shown in the prior art, an injector with phosphorus therein was suspended above the melt without any means for adjusting the height of the injector above the melt during the injection process. As a result it is impossible to control the stoichiometry of the melt and only results in an indium-rich melt. The quality of crystals grown from indium-rich melts is poor to say the least. The crystals have inclusions and precipitates, for example. A stoichiometric melt contains exactly 0.500 mole fractions of phosphorus. Further the crystals produced are twinned ones and twinned ones have no commercial value.

SUMMARY OF THE INVENTION

The present invention an apparatus for the synthesis and growth of single crystals of phosphorus compounds starting with the elemental materials in a single furnace.

The apparatus of the present invention is a crystal growth furnace heated by RF coils. Inside the furnace is a lower susceptor for holding a crucible and an upper susceptor for heating a phosphorus injector which is selectively positioned over the crucible. A first embodiment does not have the upper susceptor. The non-phosphorus materials are placed in the crucible and melted to a desired temperature. The phosphorus material placed within the injector is heated by the radiant heat from the crucible and in the second embodiment is further heated by the upper susceptor to drive the phosphorus vapor into the melt through a tube. This is closely controlled by noting the temperature within the injector and adjusting the height of the injector above the melt to control the temperature within the phosphorus material. The temperature within the crucible is further controlled by the use of a furnace baffle. After the formation of the stoichiometric melt, the seed is inserted into the melt for crystal growth through a channel in the injector. The crystal is grown by the MLEK process to a diameter close to that of the crucible with a flat top and without twins. A polycrystalline product may also be produced by this process and apparatus.

Therefore, one object of the present invention is an apparatus for producing high purity phosphorus single crystals with high yields.

Another object of the present invention is an apparatus for controlling the phosphorus vapor pressure over the melt thus insuring a stoichiometric melt from which a single crystal can be grown.

Another object of the present invention is an apparatus for synthesizing the growth materials of single crystals as well as the in-situ growth of the single crystals from those materials.

Another object of the present invention is an apparatus to produce III-V crystals without exposure to potential contamination outside the furnace environment.

Another object of the present invention is an apparatus for producing high quality InP crystals having exciton emission peaks in the photoluminescence spectra.

Another object of the present invention is an apparatus for producing InP being semi-insulating with a low concentration of iron dopant.

Another object of the present invention is an apparatus having a lower cost because of combining the synthesis and growth in one continuous operation.

Another object of the present invention is an apparatus producing a high percentage of (100) single crystal wafers.

These and many other objects and advantages of the present invention will be readily apparent to one skilled in the pertinent art from the following detailed description of a preferred embodiment of the invention and the related drawings.

BRIEF DESCRIPTION OF THE DRAWINGS

FIG. 5 is a table of growth information.

FIG. 6 compares quality of various crystals of the present invention.

DESCRIPTION OF THE PREFERRED EMBODIMENT

An investigation into the problems of growing bulk crystals having phosphorus therein, and, in particular, InP single crystals has resulted, in particular, in the discovery that controlling the phosphorus vapor pressure during injection into the indium is critical for producing stoichiometric melts.

Figure 1A:
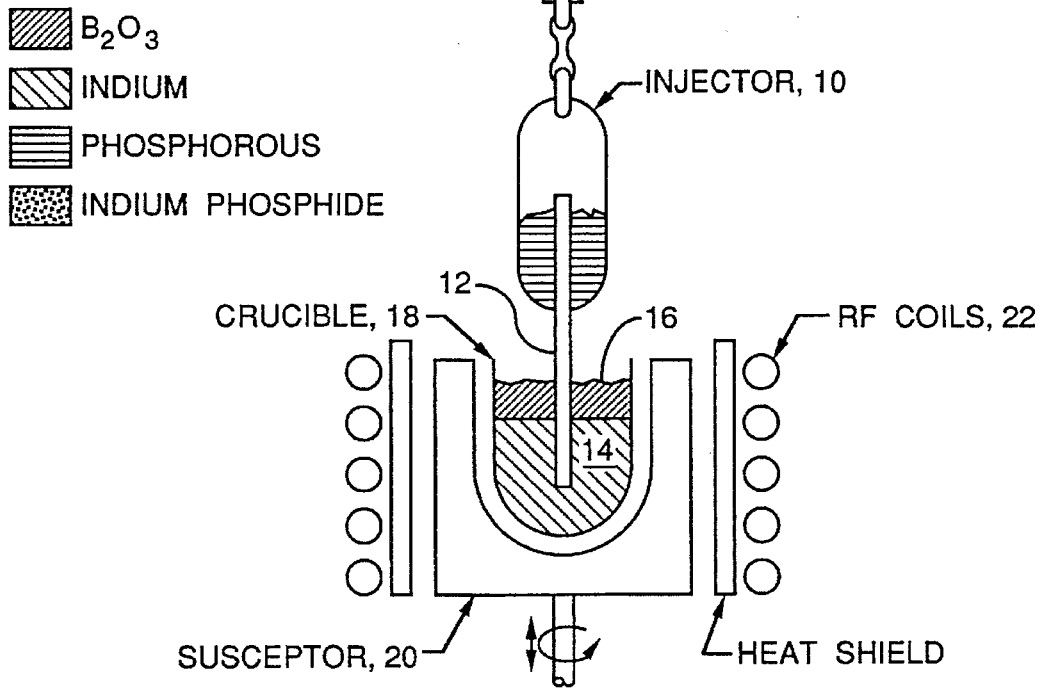
FIGS. 1(a) to (d) illustrate the sequences of the present invention.
Figure 1B:
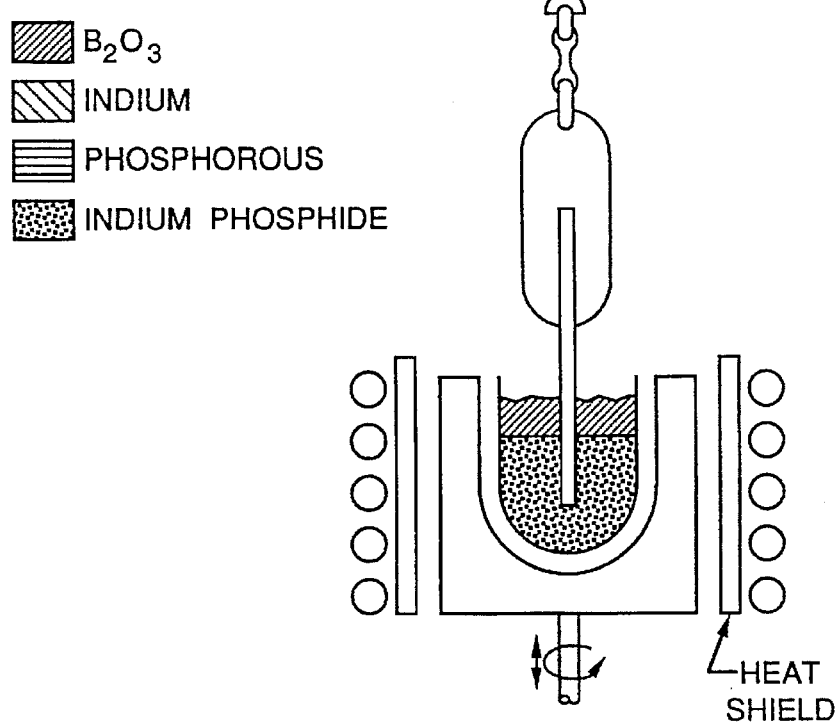
Figure 1C:
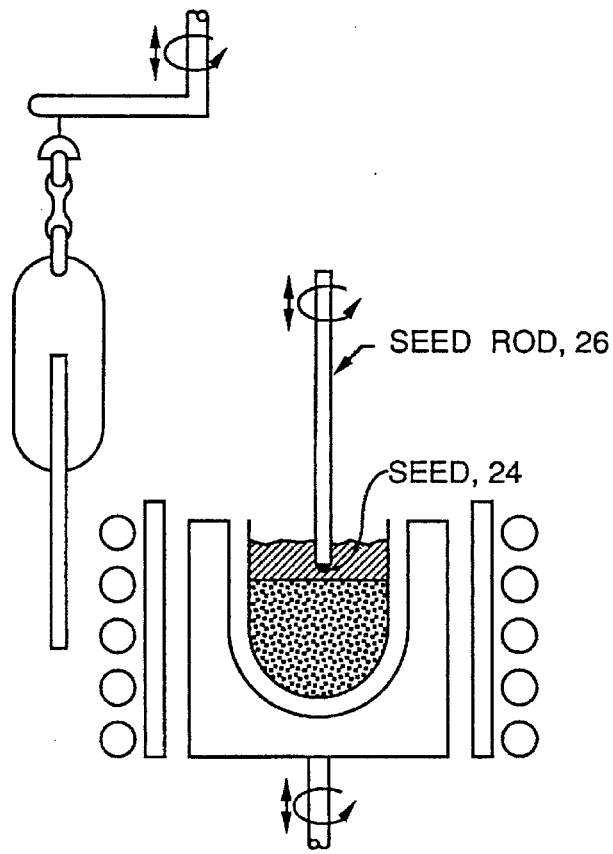
Figure 1D:
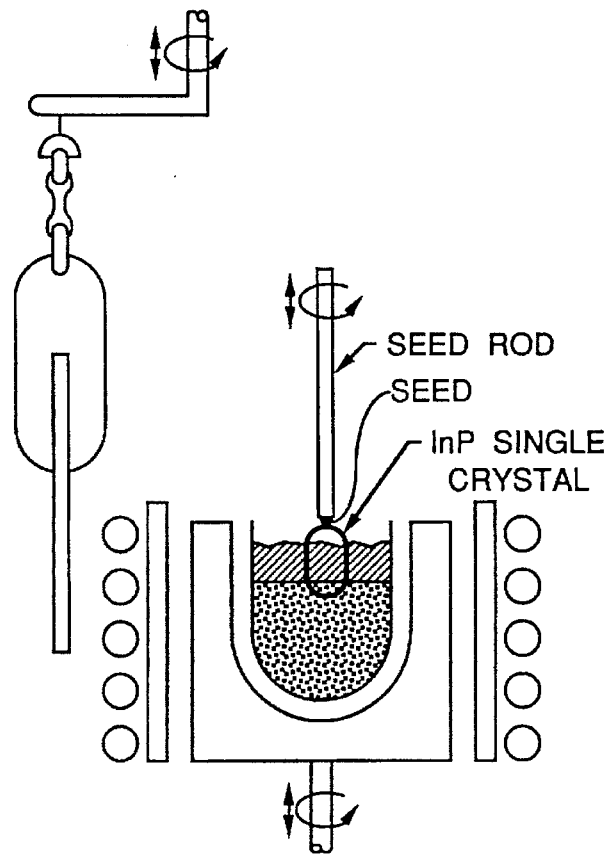

Referring to FIGS 1(a) to (d) which illustrate the steps in the process of the present invention. The furnace is not shown as well as other items therein such as means for moving the injector, seed and susceptor nor electrical means for the RF coils or water cooling needed for the RF coils. FIG. 1(a) illustrates an injector 10 having an injector tube 12 for injecting gaseous phosphorus into a melt 14 under an encapsulant layer 16 in a crucible 18 held within a susceptor 20 with heating RF coils 22 surrounding the susceptor 20. As the solid phosphorus is heated and turns into a gas it combines with the indium in the melt 14. If the proper amount of phosphorus is combined with the indium, 0.500 mole fraction, a stoichiometric melt will be produced in FIG. 1(b). Without opening the furnace, a seed 24 on a seed rod, FIG. 1(c), is inserted into the stoichiometric melt and a single crystal of InP is grown using the liquid encapsulated Czochralski process, FIG. 1(d).

Figure 2:
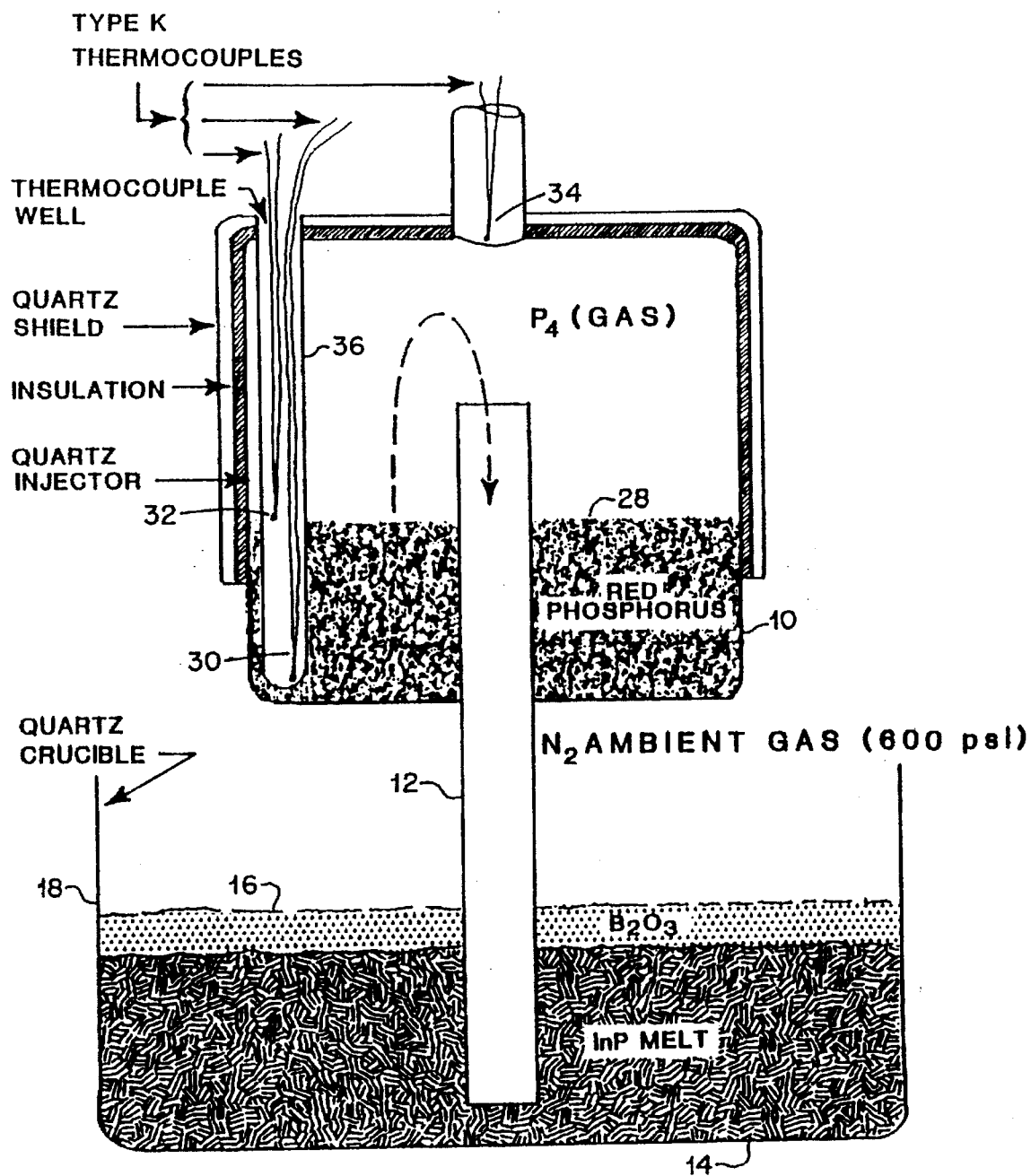
FIG. 2 is a cross section of the injector and the crucible of the present invention.
Figure 3:
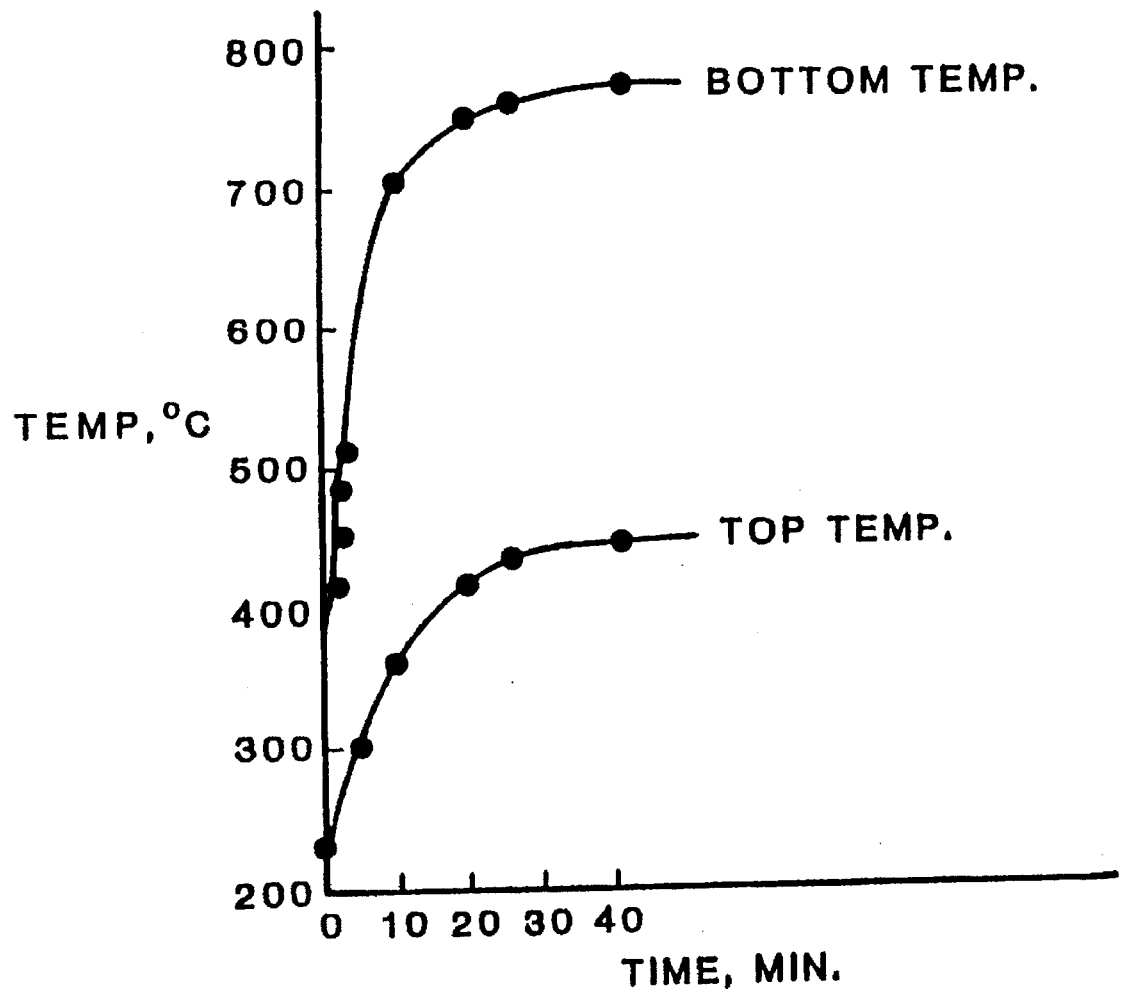
FIG. 3 is a graph of temperature inside the injector of the present invention.
Figure 4:
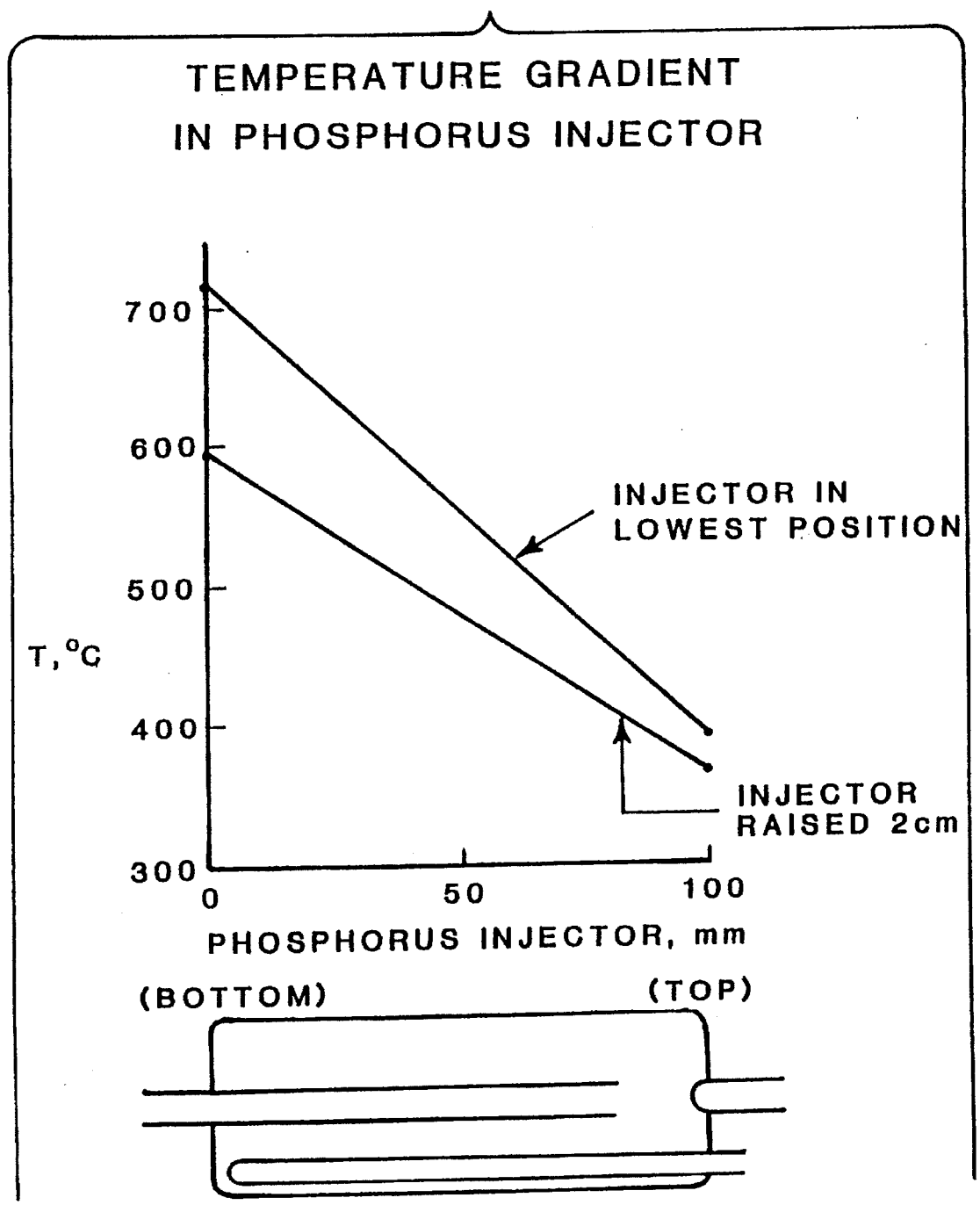
FIG. 4 is a graph of the temperature gradient in the injector of the present invention.

Referring to FIG. 2, the injector 10 is a cylindrically shaped container having the injector tube 12 extending into the container and above the red phosphorus level 28. The temperature inside the container is measured at the bottom of the injector 10, at the top of the red phosphorus and at the top of the injector 10 by thermocouples 30, 32, and 34. A well 36 is placed inside the container for holding the thermocouples 30 and 32. With the above, the temperature gradients inside the container can be measured while it moves vertically. A typical time/temperature profile is shown in FIG. 3 for a given position. Since the heating of the container is provided by the melt only in the first embodiment, the bottom temperature is clearly greater than the top temperature. These temperatures depend on the position of the injector 10, melt temperature, ambient gas pressure above the melt. The temperature gradients in the injector 10 are shown in FIG. 4 at two different positions. After each run the injector 10 and remaining charge and crystal were removed from the furnace, weighed and compared to the initial weights for determination of the stoichiometry of the melt 14. The amount of time required for complete injection of the phosphorus varied between ½ hour and 3 hours according to the temperature profile. The process was optimized at 45 minutes with an average temperature increase of 5 to 7 degrees centigrade per minute inside the injector 10.

High purity raw materials from competing sources were used for growing InP crystals, which were then characterized electrically by Hall measurements at room temperature and at 77° K., and chemically analyzed blow discharge mass spec (GDMS), to compare the quality of available starting materials. The best qualified pure indium and phosphorus were used to grow additional Fe-doped crystals with sufficient iron concentrations to compensate the shallow donor impurity levels. These crystals were compared with InP crystals grown by the two-step process to determine how much iron is required to produce semi-insulating InP crystals. Comparison between the two types of Fe-doped crystals was based on their resistivities and the photoluminescence spectra.

Figure 10:
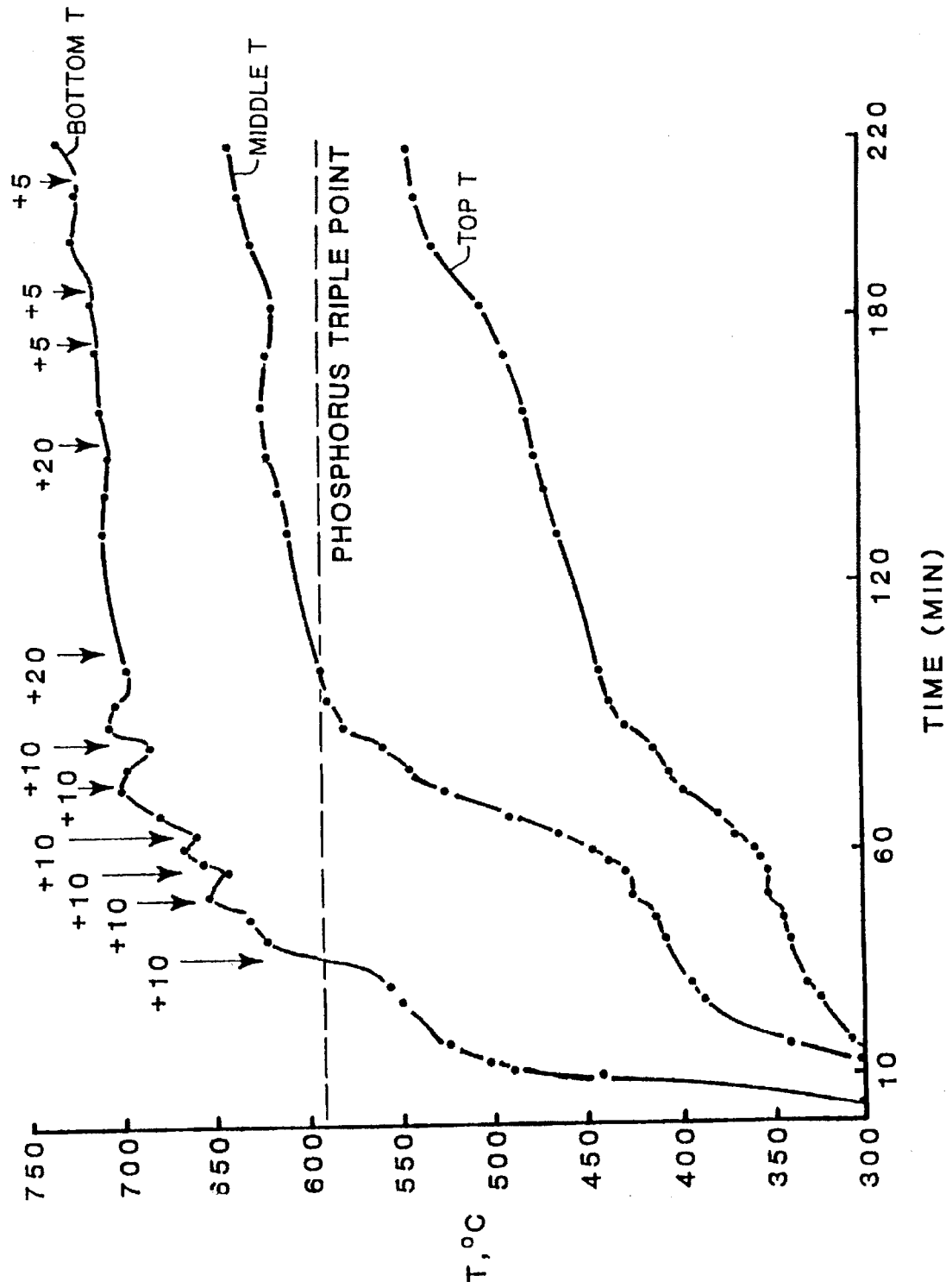
FIG. 10 is a graph of temperature as function of time in the injector when injecting phosphorus.

In controlling the phosphorus vapor pressure, the following runs indicated the importance of controlling the temperature of various sections of the injector. For FIG. 10, the injector tube was made 2 cm. longer than the standard tube. The temperature rises steadily until it reaches the phosphorus triple point. Above the triple point temperature fluctuations occur. When the rate of injection slows down, the RF power is increased to the hot zone, indirectly heating the injector. Periodic increases in the power are indicated by arrows in the FIG. 10. Small increases are used to avoid heating the bottom of the injector above 800° C., the point at which $P_4$ begins to be transformed into the less dense gas $P_2$. After three hours the middle thermocouple, indicated by the line marked middle, shows fluctuations as the temperature rises above 650° C. The color of bubbles was observed to change from clear to straw yellow. These bubbles do not dissipate quickly and some become trapped in the encapsulant forming dark brown dots. When the bubbling rate slowed the injector is removed from the melt, and the melt is cooled slowly to room temperature. The injector and charge are removed from the furnace and weighed to determine the stoichiometry of the melt.

Figure 11:
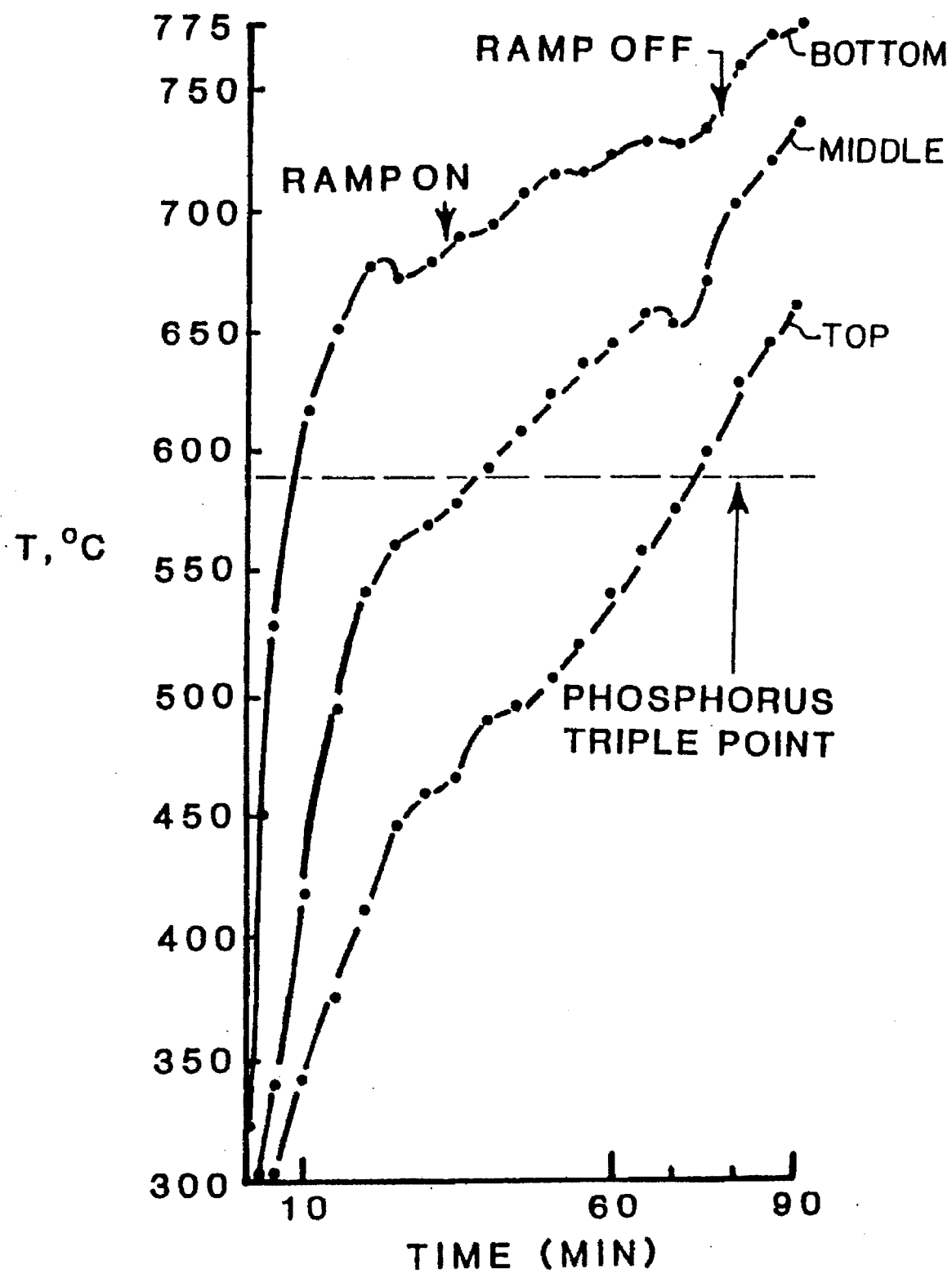
FIG. 11 is a graph of temperature as function of time in the injector when injecting phosphorus.

For FIG. 11, the injector tube was 0.9 cm. longer than the standard tube. Again the injector is lowered into the melt (1.1 cm lower than in FIG. 10) and the temperature rises steadily until the phosphorus begins to condense and flow down the walls. Thermal fluctuations can be seen as the temperature rises above the phosphorus triple point in FIG. 11. Complete discharge of the phosphorus charge is accomplished in 1½ hours. At the end of the process some phosphorus bubble do not dissolve into the melt but escape through the encapsulant. The results are weighed as above to determine the stoichiometry.

The temperature rise in the injector, the driving force for synthesis, is a critical factor in producing stoichiometric melts. A reflux condition exists inside the injector since the top temperature is below the triple point and thus phosphorus vapor condenses to a liquid there. A monotonic temperature increase is necessary to continue the reaction. Synthesis is complete when the top temperature rises above the triple point and nearly all the phosphorus is spent. Controlling the temperature increase to 5°–7° C./min has given the best results in obtaining stoichiometric melts.

Controlling melt stoichiometry is very important in producing high quality InP crystals. The phosphorus mole fraction in the melt is calculated first by finding the amount of spent phosphorus from the injector, and second by subtracting the initial indium weight from the final weight of the charge. The difference between these two weights is the phosphorus lost to the ambient. Some removal of InP from the injector tube is required to accurately determine the weight of spent phosphorus. FIG. 5 shows the weights and stoichiometry for two injection runs. In both cases the final weight consists of a solid charge only; no crystal was grown. Four other crystal growth runs are listed for comparison; here the final weight includes the crystal and remaining melt. Phosphorus loss is also larger in crystal growth runs since more phosphorus may sublime from the InP crystal during growth.

The purity of indium and phosphorus are also critical to producing high quality InP crystals. The electron mobility of InP is an indication of compensation, and therefore of purity. Hall measurements on three undoped InP crystals grown from different sources of high purity indium are shown in FIG. 6. The net donor concentration for either crystal B or crystal C is in the range 3–4E$^{15}$ cm. The mobility of both of these crystals is high, and mobility is still higher at the tail than at the seed. Crystal A has higher carrier concentration and lower mobility, with the tail lower than the seed, indicating some sort of compensating species is present. The suppliers of raw materials for crystal B and C were qualified for producing high purity InP crystals.

Chemical analysis by glow discharge mass spec (GDMS) shows the total concentration of silicon and sulfur in crystals B and C to be 2–3E15 cm³ as expected (Both the crucible and the injector are made from fused silica, which is in contact with the melt). In order to render this material semi-insulating, a deep acceptor level greater than $N_D$, the net donor concentration is required. However, we have found that for crystals grown by the two-step process, using pre-synthesized InP as a starting material, full compensation requires a total Fe concentration greater than 1E16/cm³, or about 0.2 ppm(wt) in the crystal. When the in-situ process of the present invention is used, iron doped crystals grown from either vendor B or C materials have produced consistently semi-insulating InP crystals even when the iron concentration in the crystal is only 0.1 ppm or 5E15/cm³.

Figure 7:
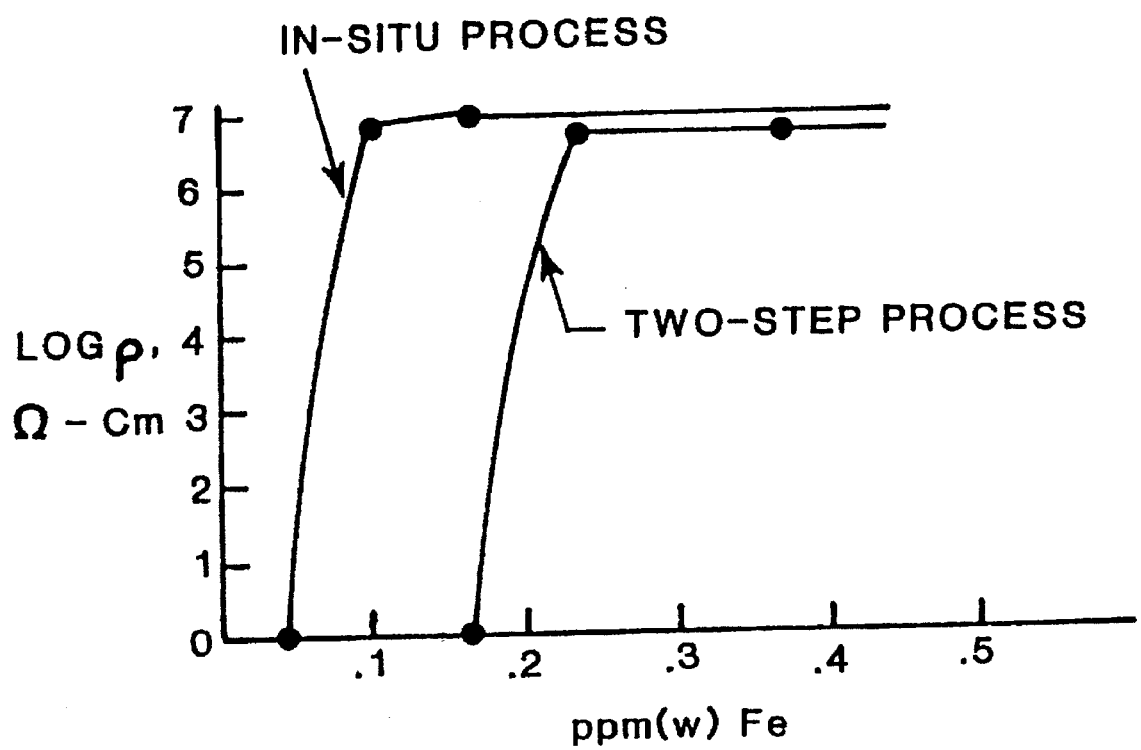
FIG. 7 is a graph of iron doping of InP.

FIG. 7 shows a comparison between in-situ crystals and two-step crystals grown with various Fe-dopant concentrations. The in-situ process allows the use of high purity starting materials to make low iron-doped InP with semi-insulating properties.

Figure 8:
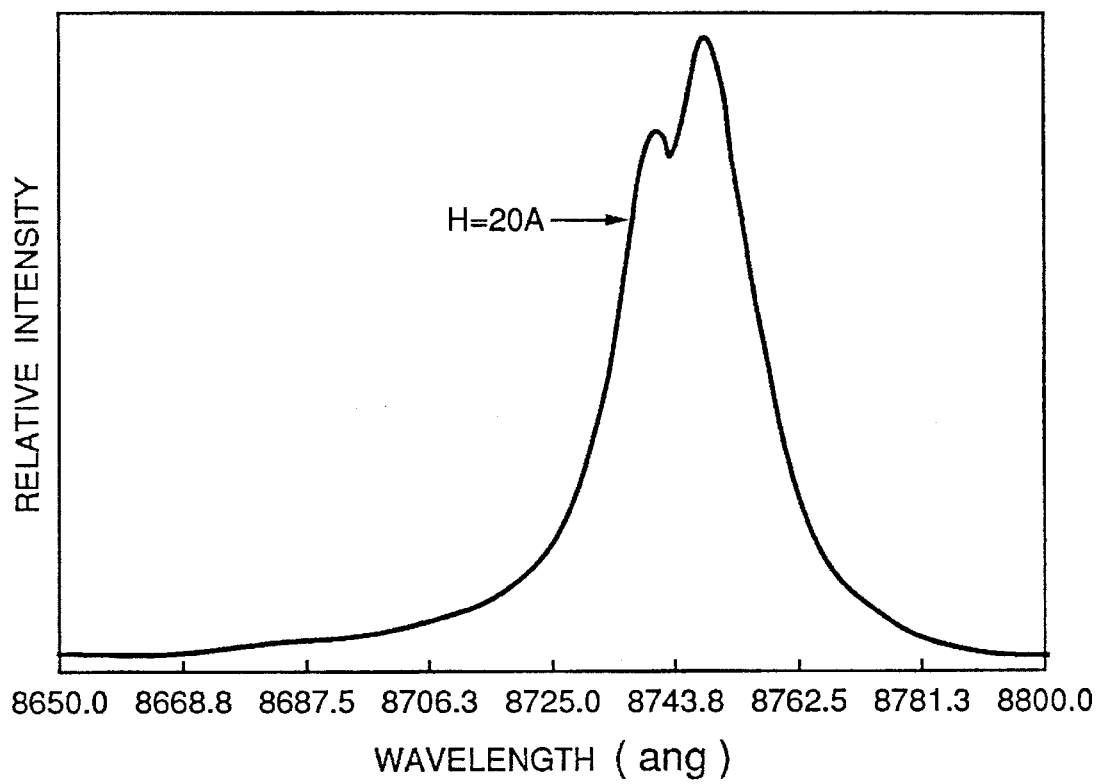
FIG. 8 is a graph of photoluminescence of the crystal of the present invention.
Figure 9:
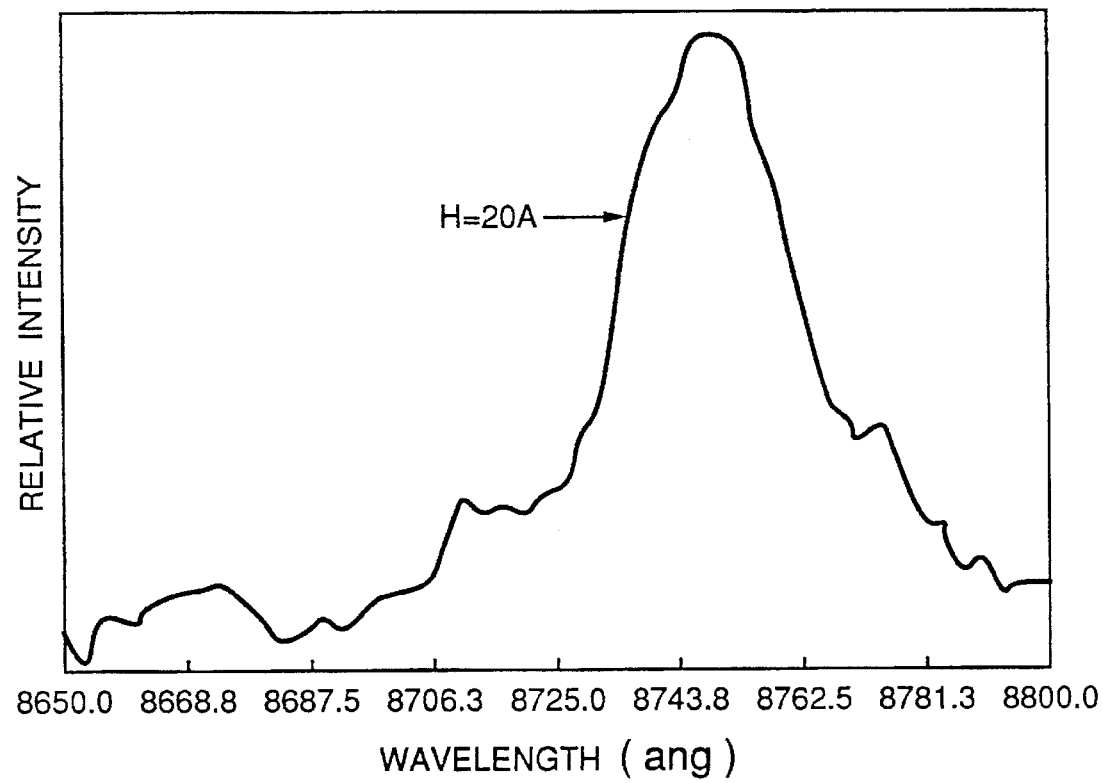
FIG. 9 is a graph of photoluminescence of the crystal prepared by the two step process.

Further analysis on in-situ and pre-synthesized crystals was carried out by comparing photoluminescence emission spectra for the two types of crystal. Samples of each crystal were cleaved to avoid inconsistencies due to surface preparation. The exciton emission peaks are shown in FIG. 8 (in-situ process) and FIG. 9 (two-step process). A distinct set of peaks is seen at 2K for the in-situ but not for the ex-situ crystal. Such a highly resolved donor-bound exciton peak, not usually seen in bulk InP, is a further indication that the in-situ process is capable of producing high purity InP crystals.

A dynamic equilibrium exists between the gas pressures within the injector and over the melt.

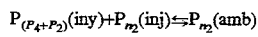

$$P_{(P_4+P_2)}(\text{iny}) + P_{n_2}(\text{inj}) \leftrightharpoons P_{n_2}(\text{amb})$$

The higher pressure on the left side of this equation prevents the melt from rising up in the tube. In addition, the driving force for synthesis occurs when the following condition is met:

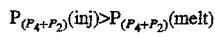

$$P_{(P_4+P_2)}(\text{inj}) > P_{(P_4+P_2)}(\text{melt})$$

The furnace and fixtures have been designed to exploit this dynamic equilibrium and to control phosphorus incorporation into the melt. The vapor pressure of phosphorus over its own solid or liquid is reported by Bachmann and Buehler. The liquid can be supercooled far below the melting point of amorphous red phosphorus, but at any given temperature the vapor pressure of the liquid is considerably higher than the solid. The triple point at 590° C. corresponds to a pressure of 42 atm, about 2 atm greater than the $N_2$ ambient pressure in the furnace. If the phosphorus injector were held isothermal at this temperature, the injection process would eventually go to completion and would produce a phosphorus-rich melt. But since the top of the injector is considerably colder than the bottom, the temperature gradient in the injector allows distillation to occur. Despite the top of the injector being below the triple point, $P_4$ gas condenses to a liquid there. Phosphorus at the bottom of the injector is vaporizing and condenses on the colder upper part. The condensed liquid drains down the side walls. This reflux process causes temperature fluctuations recorded by the bottom thermocouple. As the condensed phosphorus has a lower vapor pressure than the $N_2$ ambient, a danger exists that the ambient pressure will exceed the internal phosphorus pressure, resulting in a column of liquid rising, solidifying, and blocking the injector tube. To prevent this from happening, it is necessary to keep the temperature increasing monotonically during the injection process. The optimum rate of rise has been found experimentally to be about 5°–7° C. per minute.

At the other extreme, if the temperature rises too fast, a straw colored liquid is observed in the injector tube; if this liquid is injected through the orifice into the 1100° C. melt, the phosphorus expands rapidly and is lost as it bubbles out through the $B_2O_3$ encapsulant. Since the phosphorus is not incorporated into the indium, and indium rich melt is produced.

By controlling the injection rate, InP melts can be reproducibly made which are near stoichiometry with a minimum of impurity contamination from the environment.

Figure 12:
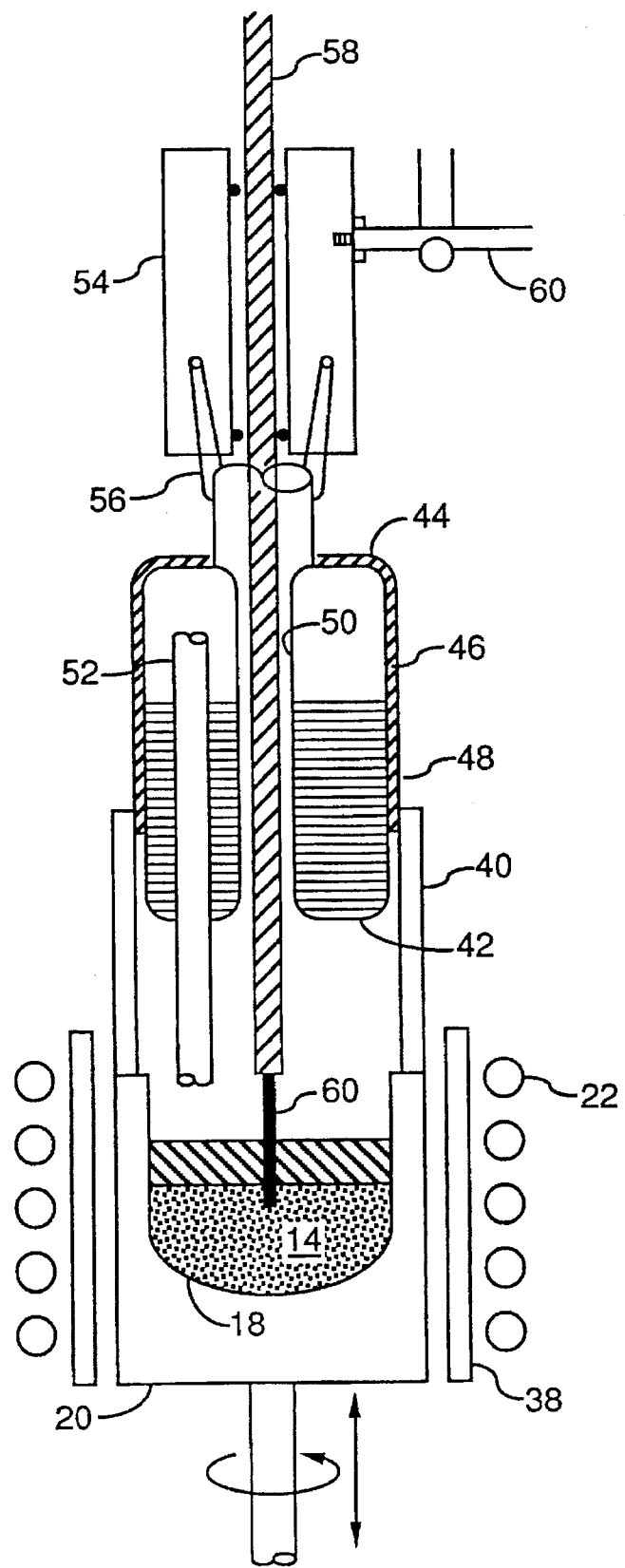
FIG. 12 illustrates by cross section an improved crystal growth apparatus of the present invention.

In order to further improve the process of growing phosphorus containing crystals, the injector apparatus is modified as shown in FIG. 12.

Several criteria of import in this embodiment are as follows: (1) containment of the phosphorus at high temperatures such as 650° C.; (2) a controllable thermal environment to heat the phosphorus to high temperatures for injection into the melt; (3) a transfer tube to allow only vapor to enter the melt; (4) a means for stirring the melt for enhanced diffusion of phosphorus into the melt; (5) a thermal environment for crystal growth at 1070° C. which is different from the injection environment; (6) independent control of the injector position and the seed position without interference.

The above conditions provide a suitable thermal environment for the growth of low dislocation density single crystals of InP, GaP, ZnGeP₂, or other phosphorus-based compounds.

As seen in FIG. 12, the susceptor 20 is attached to means for moving the susceptor 20 vertically and/or rotating it. The crucible 18 is placed within the susceptor 20. RF coils 22 heat the susceptor 20 and a heat shield 38 maintains a more uniform heating environment about the susceptor 20. In order to maintain a more uniform and controlled heating environment for an injector 42 since the only heat provided thereto is from the susceptor 20 and melt 14, a heat shield/convection baffle 40 is attached to the top of the crucible 18. The position of the baffle 40 determines the thermal gradient at the solid liquid interface; at higher positions the gradient is steeper, and conversely at lower positions the gradient is flatter. During crystal growth a flatter thermal gradient is desirable to prevent the formation of dislocations in the crystal. However, if the baffle 40 position is too low, the crystal will not grow at all. The optimum position of the baffle 40 is where the top of the crucible 18 is parallel to the top of the RF coils 22.

The injector 42 has placed thereover an injector cover 44 which has insulation 46 on the inside to prevent heat loss. The outside surface 48 of the cover 44 is placed closely within the baffle 40 and is able to move vertically therein. The injector 42 is cylindrically shaped and has a center channel 50 therethrough. The upper end of the transfer tube 52 extends a sufficient distance inside the injector 42 to prevent any liquid or solid phosphorus from entering into the melt 14. The lower end of the transfer tube 52 must be of such length that when inserted into the indium melt 14 proper temperatures and gradients and maintained in the injector 42 to cause the phosphorus vapor to enter the melt 14. The top of the injector 42 is connected to an injector support 54 by wires 56. The position of the injector 42 is controlled by a position control arm 60 that is attached to conventional translating means. The support 54 may be moved vertically to move the injector 42 within the cover 44. A shaft 58 having a seed 60 thereon can be placed through the channel 50. The crystal is grown upon the seed 60. The shaft 58 may be rotated and/or moved vertically. The only opening in the injector 42 is at the transfer tube 52 which is used for loading the injector with red phosphorus prior to each run. The injector is also evacuated through the transfer tube after being loaded with the phosphorus in order to remove oxygen and water vapor. The injector is built to withstand about a different of pressure of about 2 to 3 atmospheres. The injector 42 and the cover 44 are lowered smoothly down the inside of the baffle 40 until the transfer tube 52 reaches the indium melt. After the injection is complete, the injector is raised out of the melt to permit crystal growth. The bottom of the injector is held level with the top of the baffle 40 during crystal growth. The cavity formed between the two provides a suitable thermal environment for growth of low dislocation density single crystal material.

The above process and the apparatus disclosed can be used to produce phosphorus compound semiconductor crystals of proper stoichiometry by controlling the position above the molten charge of the injector. Although the heating of the injector is by radiant heat only, separate heating of the injector is clearly possible and will be discussed below. The internal pressure within the injector is controlled by adjustment of the injector position which determines the temperature therein. The above process can be applied to growth of III-V compound semiconductor crystals. Although not detailed, the above process and apparatus can be used in both the MLEK and the MLEC processes.

Figure 13:
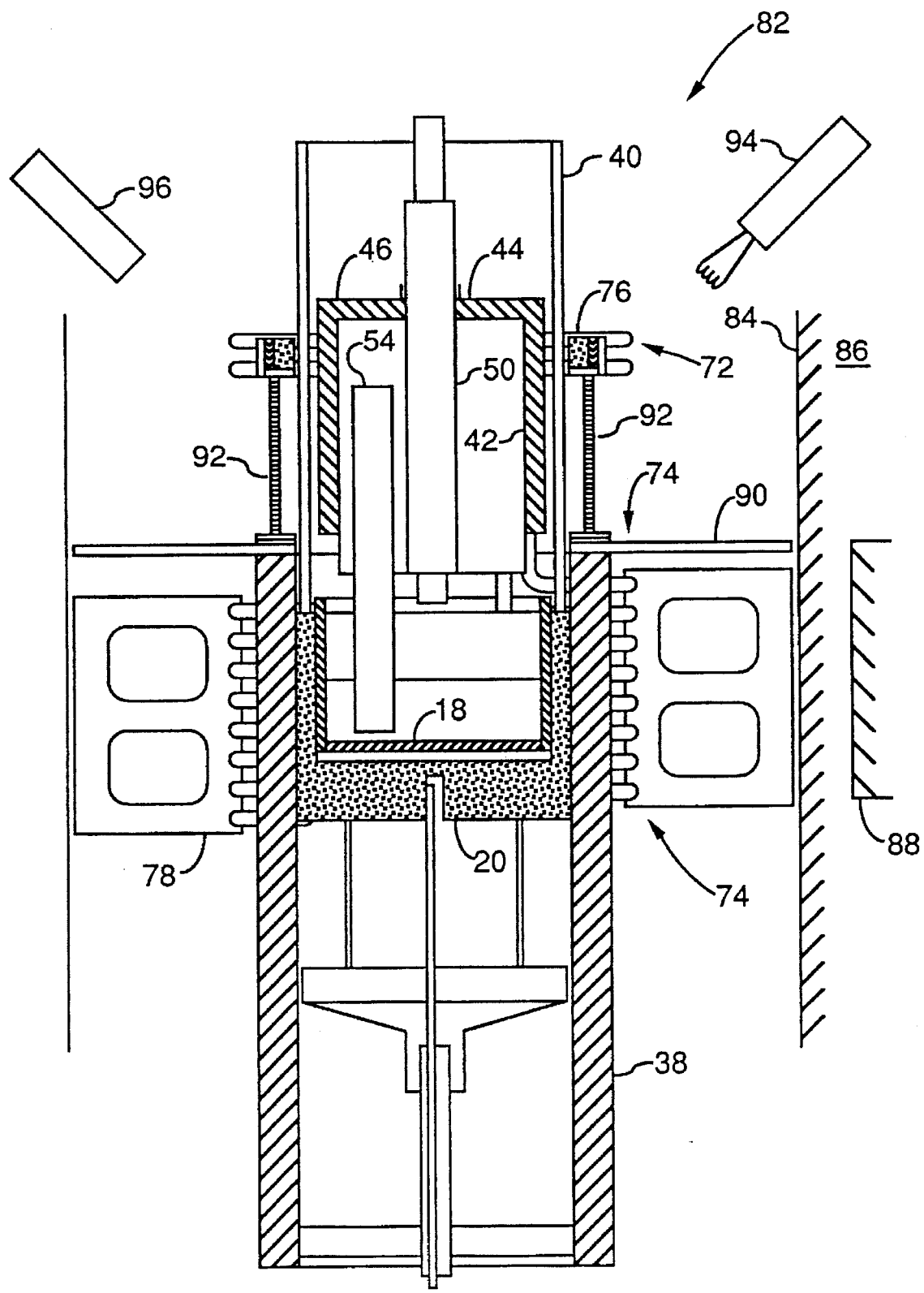
FIG. 13 illustrates by cross section an improved crystal growth apparatus having lower and upper susceptors and a baffle plate therein of the present invention.
Figure 14:
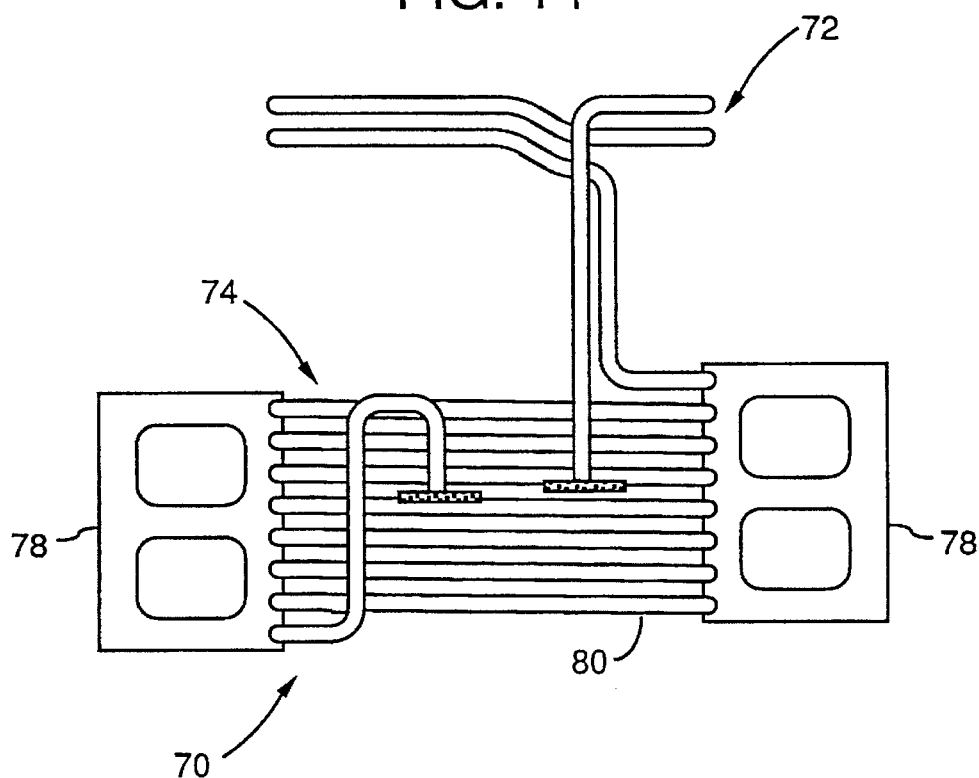
FIG. 14 illustrates the RF coil arrangement used in the crystal growth apparatus of FIG. 13.
Figure 15:
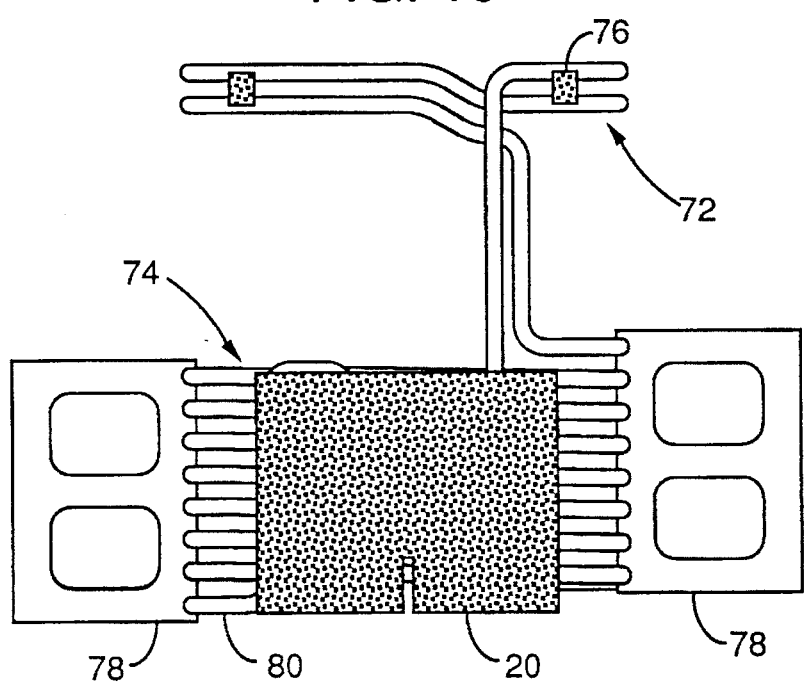
FIG. 15 illustrates the upper and lower susceptors used in the crystal growth apparatus of FIG. 13.

To further improve the above process, reference is made to FIGS. 13 to 15. In FIG. 14, a dual coil 70 device has an lower coil section 74 for heating the susceptor 20 holding the crucible 18 and an upper coil section 72 for heating an upper susceptor 76 as seen in FIG. 15. The lower coil section 74 employs several spacers 78 for holding the RF coils 80 in a fixed position. The upper coil section 74 has the upper susceptor 76 therein which is supported by plurality of columns 92 resting upon a furnace baffle 90. The upper coil section 72 and the lower coil section 74 are series connected. Thus with this arrangement of coils, the injector 42 is heated by both the lower and upper susceptors. The number of turns of each is emprically determined to optimize the growth process. Presently, two turns about 4 inches above the lower coil section result in a flatter gradient as noted as desirable above, within the ampoule which results in less adjusting of the height of the ampoule above crucible melt surface. An additional benefit is the additional heating in this region reduces clouding of the injector heat shield 40 during and after injection due to the small quantities of phosphorus that do escape the melt and encapsulant. This feature allows a continued clear view of the melt which enhances subsequent seeding and growth of the single crystal from the melt. The furnace baffle 90 being ring shaped is placed on top of the heat shield 38 and substantially fills the space with the furnace walls 84 and prevents the turbulence of heated gases thereby. This baffle may be quartz or graphite. This furnace baffle 90 divides the furnace into two smaller gas turbulence zones. The furnace has cold walls which are water cooled and the high gas pressure propagates extremely high and turbulent thermal convective flows with high heat transfers which result in high thermal gradients.

Referring to FIG. 13, a crystal growth apparatus 82 is shown therein. This apparatus is contained within a pressurized chamber 86 having an inner wall 84, no other details are shown. Outside of this chamber 86 is an electromagnet 88 being two large, water cooled, copper Helmholtz coils for providing a high axial flux to the crucible 18. This produces a magnetic field with the special 316 stainless steel pressure chamber 86 on the order of two kilogauss as measured in the center of the region of the melt volume. This field interacts with the liquid InP to resist motion with the Lorentz forces. This inhibits convention flows in the melt thereby reducing temperature fluctuations within the melt. Temperature fluctuations generate striations by growth and melt back in the growing crystal which are visible manifestations of variations in dopant concentrations.

When growing from a seed using this apparatus, the first step is to achieve contact with the melt at a temperature which does not melt the seed end off and break melt/seed contact or freeze out the melt too quickly. The first problem is obvious and is a result of too hot a melt surface. The second problem is a result of too cool a melt surface and an existing supercooling of the melt below the usual melting temperature. When this second condition exists, the rapid solidification typically results in loss of the seed pattern with twinning or polycrystalline formation.

The second step after successful seed/melt contact is increasing the crystal diameter. In traditional LEC process this is done gradually while pulling and results in a taper. The angle of the taper can contribute to the promotion of twinning in the crystal. The optimum angles for suppressing twinning depend on the seed's crystallographic orientation: 19° off growth direction for (111) seeds and 34° for (001) seeds. These angles produce cones which can not be used for optimum diameter wafers, and therefore contribute to low yield.

Alternatively, the LEK growth technique can be used for this second step to optimize wafer production. Instead of pulling and extending the diameter with a taper, the diameter is extended gradually without pulling or taper for a flat top growth. This is accomplished by slowly lowering the power, and therefore the temperature, only. Rather than completely avoiding the undesirable twin-promoting growth-angles, the crowning or shouldering passes through this angle very briefly which minimizes but not eliminates the opportunity for twinning. The final result is no lost cone volume or yield reduction.

To insure of twin-free growth, the top of the crown is observed during growth. The flat top develops symmetry features which are readily observed optically. This observation is brought about with the use of an ordinary high intensity light source which reflects light off the flat top surface. This is accomplished with the introduction of light at a high angle (60°) through one furnace port fitted with a quartz viewing rod 94 which contributes to light-piping to nearer the melt surface and picking up the reflection through a similar light pipe 96 and furnace port at the same high angle, but 180° around the circumference of the furnace.

Clearly, many modifications and variations of the present invention are possible in light of the above teachings and it is therefore understood, that within the inventive scope of the inventive concept, the invention may be practiced otherwise than specifically claimed.

What is claimed is:

1. An improved crystal growth apparatus, said crystal growth apparatus having a chamber with an interior which can be pressurized and holds a crystal growth furnace which has a crucible, said crucible holds material to grow at least one crystal therein, said chamber has means thereon for controlling movement within said chamber from a top and a bottom, said chamber has ports therein for viewing an interior of said chamber, said chamber has cooling means therein, wherein an improvement of said improved crystal growth apparatus comprises:

means for providing RF power to said interior of said chamber;

means within said interior for receiving said RF power, said means for receiving having a dual coil device therein, said dual coil device comprising:
- a lower coil, said lower coil being a plurality of turns of metal tubing, said metal tubing being held in position by a plurality of spacers, said lower coil acting upon a susceptor surrounding said crucible to generate heat therein; and
- an upper coil, said upper coil being a plurality of turns of metal tubing, said upper coil acting upon an upper susceptor surrounding said means for injecting, said upper coil and said lower coil being electrically connected to transfer RF power therebetween;

means for holding said crucible within said interior;

means for retaining heat within said crucible;

means for injecting phosphorus into a melt in said crucible;

means for preventing a flow of turbulent gases within said chamber;

means for holding said means for injecting phosphorus.

2. An improved crystal growth apparatus as defined in claim 1 wherein said upper coil and said lower coil are electrically connected in series to transfer RF power therebetween.

3. An improved crystal growth apparatus as defined in claim 1 wherein said upper coil has at least two turns.

4. An improved crystal growth apparatus as defined in claim 1 wherein said means for retaining heat comprises:
- a heat shield, said heat shield being a cylindrical tube having a lower susceptor therein; and
- an injector heat shield, said injector heat shield being positioned on top of said heat shield and extending substantially beyond a top of said injector.

5. An improved crystal growth apparatus as defined in claim 1 wherein said means for preventing a flow is a baffle, said furnace baffle being positioned above said heat shield and below said injector heat shield and being ring shaped, said furnace baffle having an outer edge in close proximity to a furnace wall to prevent the flow of turbulence thereby.

* * * * *